United States Patent
Chen et al.

(10) Patent No.: US 12,158,570 B2
(45) Date of Patent: Dec. 3, 2024

(54) HIGH BRIGHTNESS FIBER COUPLED DIODE LASERS WITH CIRCULARIZED BEAMS

(71) Applicant: nLIGHT, Inc., Camas, WA (US)

(72) Inventors: Zhigang Chen, Portland, OR (US); Jay Small, Vancouver, WA (US); Manoj Kanskar, Portland, OR (US)

(73) Assignee: nLIGHT, Inc., Camas, WA (US)

( * ) Notice: Subject to any disclaimer, the term of this patent is extended or adjusted under 35 U.S.C. 154(b) by 269 days.

(21) Appl. No.: 17/634,912

(22) PCT Filed: Aug. 14, 2020

(86) PCT No.: PCT/US2020/046440
§ 371 (c)(1),
(2) Date: Feb. 11, 2022

(87) PCT Pub. No.: WO2021/030718
PCT Pub. Date: Feb. 18, 2021

(65) Prior Publication Data
US 2022/0385043 A1   Dec. 1, 2022

Related U.S. Application Data

(60) Provisional application No. 62/886,907, filed on Aug. 14, 2019, provisional application No. 62/886,912, filed on Aug. 14, 2019.

(51) Int. Cl.
*G02B 19/00* (2006.01)
*G02B 6/42* (2006.01)
(Continued)

(52) U.S. Cl.
CPC ....... *G02B 19/0014* (2013.01); *G02B 6/4206* (2013.01); *G02B 19/0057* (2013.01);
(Continued)

(58) Field of Classification Search
None
See application file for complete search history.

(56) References Cited

U.S. PATENT DOCUMENTS 6,240,116 B1 *  5/2001  Lang .................. G02B 27/0977
                                                         372/50.23
7,061,690 B1     1/2006  Berger
(Continued)

FOREIGN PATENT DOCUMENTS

CN   1276064   12/2000
CN   1553244   12/2004
(Continued)

OTHER PUBLICATIONS

International Search Report and Written Opinion for related International Application No. PCT/US2020/046440, 7 pages, mailed Oct. 29, 2020.
(Continued)

*Primary Examiner* — Jerry Rahll
(74) *Attorney, Agent, or Firm* — Wiley Rein LLP

(57) ABSTRACT

Apparatus include a plurality of laser diodes configured to emit respective laser diode beams having perpendicular fast and slow beam divergence axes mutually perpendicular to respective beam axes, and beam shaping optics configured to receive the laser diode beams and to circularize an ensemble image space and NA space of the laser diode beams at an ensemble coupling plane. In selected examples, beam shaping optics include variable fast axis telescopes configured to provide variable fast axis magnification and beam displacement.

20 Claims, 8 Drawing Sheets

(51) Int. Cl.
*G02B 27/09* (2006.01)
*G02B 27/30* (2006.01)
*H01S 5/02315* (2021.01)
*H01S 5/40* (2006.01)

(52) U.S. Cl.
CPC ......... *G02B 27/0905* (2013.01); *G02B 27/30* (2013.01); *H01S 5/02315* (2021.01); *H01S 5/4012* (2013.01); *H01S 5/4025* (2013.01)

(56) References Cited

U.S. PATENT DOCUMENTS

| | | |
|---|---|---|
| 2004/0174604 A1 | 9/2004 | Brown |
| 2007/0053066 A1 | 3/2007 | Mitra |
| 2007/0195850 A1 | 8/2007 | Schluter et al. |
| 2007/0237455 A1 | 10/2007 | Sonoda |
| 2009/0129420 A1 | 5/2009 | Regaard et al. |
| 2011/0019710 A1 | 1/2011 | Strohmaier et al. |
| 2015/0362739 A1 | 12/2015 | Zambuto et al. |
| 2016/0161751 A1 | 6/2016 | Kiontke et al. |
| 2016/0173837 A1* | 6/2016 | Miyata ................. H04N 9/3111 353/31 |
| 2016/0274368 A1 | 9/2016 | Gurevich |
| 2017/0235057 A1 | 8/2017 | Hemenway et al. |
| 2022/0382028 A1 | 12/2022 | Small et al. |

FOREIGN PATENT DOCUMENTS

| | | |
|---|---|---|
| CN | 1885094 | 12/2006 |
| CN | 105700279 | 6/2016 |
| CN | 105759411 | 7/2016 |
| EP | 0723834 | 7/1996 |
| EP | 3035119 | 6/2016 |
| GB | 1530066 | 10/1978 |
| WO | WO 2004/047239 | 6/2004 |
| WO | WO2015/086425 | 6/2015 |

OTHER PUBLICATIONS

International Search Report and Written Opinion for related International Application No. PCT/US2020/046443, 6 pages, mailed Nov. 5, 2020.

* cited by examiner $$Z = \frac{cy^2}{1+\sqrt{1-(1+k)c^2y^2}} + \sum_{i=1}^{2}(A_i y^{2i})$$

Key

| S1 | asphere | | |
|---|---|---|---|
| | c | = | 0.278 ± 0.004 |
| | k | = | -0.92 ± 0.03 |
| | $A_1$ | = | 0.227 |
| | $A_2$ | = | 0 |
| S2 | asphere | | |
| | c | = | -0.333 ± 0.003 |
| | k | = | -8.0 ± .03 |
| | $A_1$ | = | -0.195 |
| | $A_2$ | = | -1.92 E-3 |

∘ Slope tolerance = 0.8'
Slope integration length = 1
Spatial sampling resolution = 0.15

HIGH BRIGHTNESS FIBER COUPLED DIODE LASERS WITH CIRCULARIZED BEAMS

CROSS-REFERENCE TO RELATED APPLICATIONS

This is the U.S. National Stage of International Application No. PCT/US2020/046440, filed Aug. 14, 2020, which was published in English under PCT Article 21 (2), which in turn claims the benefit of U.S. provisional application 62/886,907, filed Aug. 14, 2019. This application also claims the benefit of U.S. provisional application 62/886,912 entitled "VARIABLE MAGNIFICATION AFOCAL TELESCOPE ELEMENT" also filed Aug. 14, 2019. These applications are incorporated by reference herein.

This application is related to U.S. application Ser. No. 15/435,117 filed Feb. 16, 2017 (and issued as U.S. Pat. No. 10,261,261), which is incorporated herein by reference.

FIELD

The field is laser diode beam shaping and combining.

BACKGROUND

There is a great demand for fiber-coupled high-power, high-brightness diode lasers for applications such as fiber laser pumping and materials processing. In existing fiber-coupled laser diode package devices, multiple single-emitter diode lasers emit respective beams that are stacked in the fast axis to achieve power scaling and brightness improvement. However, additional improvements to brightness are desirable for at least the above mentioned applications.

SUMMARY

Apparatus and methods involve laser diode packages having optics that can be used to shape and circularize the ensemble image and divergence spaces of a plurality of laser diode beams at a coupling plane.

According to an aspect of the disclosed technology, apparatus include a plurality of laser diodes configured to emit respective laser diode beams having perpendicular fast and slow beam divergence axes mutually perpendicular to respective beam axes, and beam shaping optics configured to receive the laser diode beams and to circularize an ensemble image space and NA space of the laser diode beams at an ensemble coupling plane. In some examples, the beam shaping optics include a plurality of fast axis collimators with different focal lengths configured to produce different corresponding fast axis magnifications for the respectively received beams, and a plurality of slow axis collimators with different focal lengths configured to produce different corresponding slow axis magnifications for the respectively received beams. In some examples, the laser diodes are arranged on stairs of a base such that the fast beam divergence axes are parallel to and spaced apart from each other and such that the beam axes are nonlinearly spaced apart from each other along the direction of the parallel fast beam divergence axes. In some examples, the beam shaping optics further include a fast axis beam compressor configured to receive the laser diode beams having the respective magnifications as collimated beams and to produce an afocal nonlinear beam displacement along a fast axis direction. In some examples, the beam shaping optics include an afocal fast axis telescope configured to receive the laser diode beams as fast-axis and slow-axis collimated beams with the beam axes parallel to each other and stacked along a common fast axis to define a plurality of initial beam displacements relative to an optical axis of the afocal fast axis telescope, and to compress the laser diode beams along the common fast axis such that, for a linear increase in input beam displacement from the optical axis, the afocal fast axis telescope produces an increasing fast-axis compressed beam magnification and a nonlinear increase in a compressed beam displacement from the optical axis. In some afocal fast axis telescope examples, the beam shaping optics further include a plurality of slow axis collimators with different focal lengths configured to produce different corresponding slow axis magnifications for the respective laser diode beams. In some afocal fast telescope examples, the plurality of laser diodes includes waveguide dimensions that are different for different ones of the laser diodes to define different respective divergences along the slow axis beam divergence axes. In some afocal fast telescope examples, the afocal telescope includes first and second surfaces having respective curvatures that circularize the ensemble image space and NA space of the laser diode beams at the ensemble coupling plane by elongating images at the ensemble coupling plane along the common fast axis for laser diode beams having smaller input beam displacements relative to the optical axis and shortening images at the ensemble coupling plane along the common fast axis for laser diode beams having larger input beam displacements relative to the optical axis. In some examples, the beam shaping optics include a plurality of slow axis collimator pairs comprising first and second slow axis collimators, each slow axis collimator pair configured to receive one of the laser diode beams and to produce a slow axis collimated beam after the second slow axis collimator, wherein the first slow axis collimators have a common focal length and the second slow axis collimators have a common focal length, wherein for each slow axis collimator pair, a distance between first and second slow axis collimators of the pair and a distance between a diode facet and the first slow axis collimator are arranged to produce a different slow axis image magnification for different respective laser diode beams. In some first and second SAC examples, the laser diodes are arranged on stairs of a base such that the fast beam divergence axes are parallel to and spaced apart from each other and such that the beam axes are nonlinearly spaced apart from each other along the direction of the parallel fast beam divergence axes. In some first and second SAC examples, the beam shaping optics include an afocal fast axis telescope configured to receive the laser diode beams as fast-axis and slow-axis collimated beams with the beam axes parallel to each other and stacked along a common fast axis to define a plurality of initial beam displacements relative to an optical axis of the afocal fast axis telescope, and to compress the laser diode beams along the common fast axis such that, for a linear increase in input beam displacement from the optical axis, the afocal fast axis telescope produces an increasing fast-axis compressed beam magnification and a nonlinear increase in a compressed beam displacement from the optical axis. In some examples, the beam shaping optics include a plurality of first slow axis collimators configured to receive respective laser diode beams, wherein the first slow axis collimators have different focal lengths, a common second slow axis collimator configured to receive the laser diode beams and to produce respective slow axis collimated beams after the second slow axis collimator, wherein distances between first slow axis collimators and the second slow axis collimator and a distance between diode facets and the first slow axis collimators are arranged to produce a different slow axis image magnification for different respective laser diode beams. In some examples, the laser diodes are arranged on stairs of a base such that the fast beam divergence axes are parallel to and spaced apart from each other and such that the beam axes are nonlinearly spaced apart from each other along the direction of the parallel fast beam divergence axes. In some examples with first SACs, the beam shaping optics include an afocal fast axis telescope configured to receive the laser diode beams as fast-axis and slow-axis collimated beams with the beam axes parallel to each other and stacked along a common fast axis to define a plurality of initial beam displacements relative to an optical axis of the afocal fast axis telescope, and to compress the laser diode beams along the common fast axis such that, for a linear increase in input beam displacement from the optical axis, the afocal fast axis telescope produces an increasing fast-axis compressed beam magnification and a nonlinear increase in a compressed beam displacement from the optical axis. In some examples, the beam shaping optics include an afocal fast axis telescope configured to receive the laser diode beams with the beam axes parallel to each other and stacked along a common fast axis, and configured to compress the beams along the common fast axis such that, for a linear increase in parallel input beam displacement from an optical axis of the afocal fast axis telescope along the common fast axis, the afocal fast axis telescope produces a decreasing fast-axis image magnification and a nonlinear increase in a transmitted parallel beam displacement along the common fast axis, and an afocal slow axis telescope configured to receive the laser diode beams with the beam axes parallel to each other and stacked along the common fast axis, and configured to produce an increase in slow-axis image magnification for an increase in parallel input beam displacement from an optical axis of the afocal slow axis telescope along the common fast axis. In some examples, the afocal fast axis telescope and the afocal slow axis telescope form a combined afocal telescope having at least one curved surface rotationally symmetric about a common optical axis.

According to another aspect of the disclosed technology, methods include arranging a plurality of laser diodes in a laser diode package, wherein the laser diodes are configured to emit respective laser diode beams having perpendicular fast and slow beam divergence axes mutually perpendicular to respective beam axes, and arranging beam shaping optics in the laser diode package, wherein the beam shaping optics are configured to receive the laser diode beams and to circularize an ensemble image space and NA space of the laser diode beams at an ensemble coupling plane. In some examples, the arranged beam shaping optics include an afocal fast axis telescope configured to receive the laser diode beams as fast-axis and slow-axis collimated beams with the beam axes parallel to each other and stacked along a common fast axis to define a plurality of initial beam displacements relative to an optical axis of the afocal fast axis telescope, and to compress the laser diode beams along the common fast axis such that, for a linear increase in input beam displacement from the optical axis, the afocal fast axis telescope produces an increasing fast-axis compressed beam magnification and a nonlinear increase in a compressed beam displacement from the optical axis. Additional method examples include arranging any of the other structures described herein including in various combinations in a laser diode package.

According to another aspect of the disclosed technology, methods include emitting a plurality of laser diode beams from respective laser diodes, wherein the laser diode beams have perpendicular fast and slow beam divergence axes mutually perpendicular to respective beam axes, and circularizing an ensemble image space and NA space of the laser diode beams at an ensemble coupling plane with beam shaping optics configured to receive the laser diode beams. In some examples, the beam shaping optics include an afocal fast axis telescope configured to receive the laser diode beams as fast-axis and slow-axis collimated beams with the beam axes parallel to each other and stacked along a common fast axis to define a plurality of initial beam displacements relative to an optical axis of the afocal fast axis telescope, and to compress the laser diode beams along the common fast axis such that, for a linear increase in input beam displacement from the optical axis, the afocal fast axis telescope produces an increasing fast-axis compressed beam magnification and a nonlinear increase in a compressed beam displacement from the optical axis. Additional method examples include shaping beams to circularize the ensemble image space and NA space using any of the other beam shaping optical structures described herein including in various combinations.

The foregoing and other objects, features, and advantages of the disclosed technology will become more apparent from the following detailed description, which proceeds with reference to the accompanying figures.

BRIEF DESCRIPTION OF THE DRAWINGS

FIG. 4B also shows an example with a second SAC lens element forming a common element of respective SAC lens pairs.

DETAILED DESCRIPTION

A maximum number of emitter beams that can be coupled into a given fiber is typically ultimately determined by the beam parameter product (BPP) of the single emitter diode lasers used to generate corresponding laser beams. However, to maximize the use of the available brightness of the emitted beams, it can also be important to efficiently arrange the laser diodes both optically and physically so as to fill up the available numerical aperture of the optical fiber in which the beams are coupled. For example, an issue that prevents maintaining single emitter brightness is the typically rectangular beam shape in both physical and angular space and the mismatch with the circular space of the fiber. Thus, in representative examples herein, the circular space of an output fiber is filled through beam shaping of the diode laser beams, thereby allowing more single emitter beams coupled into the same fiber, so that brightness improvement can be achieved.

Figure 1A:
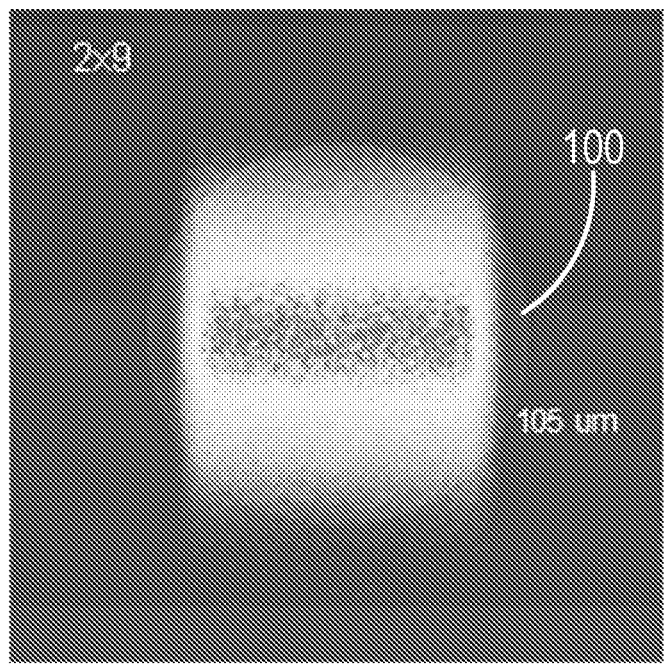
FIG. 1A is an image of an optically modeled spot at an input of a 105 μm fiber and 0.15 NA, for a high brightness diode laser pump at 976-nm with a total of 9 emitters per polarization, with >97% fiber coupling efficiency and >99% power enclosure within 0.15 NA.
Figure 1B:
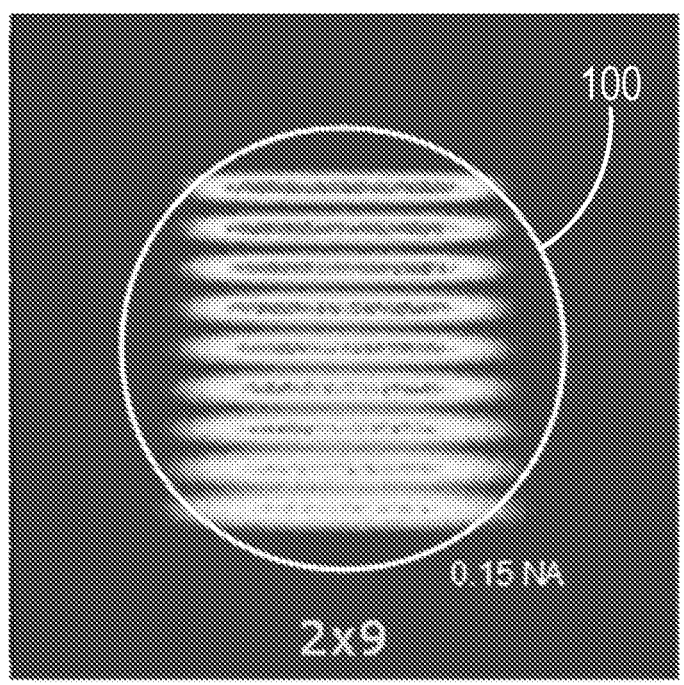
FIG. 1B is an image of an optically modeled NA excitation at the input of the fiber shown in FIG. 1A.

In various examples herein, high brightness fiber-coupled laser diode packages maximize a laser diode emitter count used to generate corresponding beams that can be coupled into a selected fiber BPP. In one example, a high brightness package includes eighteen emitters operating at 976-nm, with 9-emitters per polarization (×2 polarization multiplexed), providing 250-W of fiber-coupled optical power at 976-nm into a 105-μm, 0.15 NA beam. Such a high brightness package can produce a focused spot with focusing optics at a circular input face 100 of an optical fiber, as shown in the optically modeled image in FIG. 1A. FIG. 1B shows an optical model image of the same input face 100 but instead for a numerical aperture (NA) excitation. Thus, even with efficient vertical stacking of the beams in physical and NA space, further brightness scaling can be achieved by filling in the large "dead space" in the physical and NA space (or image and angle space) due to mismatch between a circular space of the fiber and a rectangular shape of the beams. In various examples herein, beam shaping is applied with beam shaping optics at or before an afocal plane of emitted laser diode beams so as to utilize a more complete space of a circular output fiber (both physical and NA) or other circular output aperture.

In various laser diode package examples, a plurality of laser diodes emit respective laser diode beams typically with asymmetric divergences across perpendicular axes mutually perpendicular to emission axes. The asymmetric divergences are typically associated with the large aspect ratios of the facets of the laser diodes, such that a fast divergence is obtained across the narrower dimension (e.g., an emitter thickness typically corresponding to a growth direction in semiconductor laser diode examples) and a slow divergence is obtained across a wider direction (e.g., a lateral or exit facet width direction). The fast divergence and slow divergence can be defined along respective perpendicular axes which can be referred to as fast axes and slow axes. After beam shaping, the beams are imaged at an output aperture, such as a fiber aperture. The fast axis and slow axis image spot sizes of a diode laser beam i at the fiber aperture can be approximately expressed as, respectively, $$D^i_{FA} = B^i_{FA} \times \frac{f_O}{f^i_{FAC} \times M^i_{FAT}}, \quad (1)$$

$$D^i_{SA} = B^i_{SA} \times \frac{f_O}{f^i_{SAC} \times M^i_{SAT}}, \quad (2)$$

where $B_{FA}$ and $B_{SA}$ are the diode beam size (near field) in the fast and slow axis, $f_O$, $f_{FAC}$ and $f_{SAC}$ are the focal length of the objective lens, FAC, and SAC lens, and $M_{FAT}$ and $M_{SAT}$ are the magnifications of the fast axis telescope (FAT) and slow axis telescope (SAT), respectively. In the laser diode package example shown in FIG. 1B, the diodes, including their beam sizes, and the powers of the optics are the same for each diode beam, and therefore produce an approximately same image spot size at the fiber aperture. The images of all the diode laser beams therefore overlap with each other after focusing, as shown in the ensemble image in FIG. 1A. An ensemble fast axis NA of the beam stack and a slow axis NA of the diode laser beam i, respectively, is approximately:

$$NA_{FA} = \sum_i \frac{d^i_{stair} \times M^i_{FAT}}{2 \times f_O}, \quad (3)$$

$$NA^i_{SA} = \frac{\varphi^i_{SA} \times f^i_{SAC}}{2 \times f_O}, \quad (4)$$

where $d_{stair}$ is a diode laser stair height (e.g., a physical vertical spacing between adjacent diode laser beam axes as emitted from respective laser diodes), and of $\varphi_{SA}^i$ is a slow axis full width divergence angle of each laser diode beam.

Specifically, the ensemble NA excitation shown in FIG. 1B includes nine diode beams per polarization stacked in vertical direction (two polarizations overlapping each other), with each beam having the same slow axis NA, and the fast axis NA being defined by the sum of the associated stair heights.

In representative examples, the circular space of the fiber is filled through beam shaping, such that different beams in the vertical stack are shaped differently. For example, diode beams near the center of the vertical beam stack are shaped in the slow axis direction to have larger slow axis NA than diode beams near the edge of the beam stack. Because of the conservation of the slow axis BPP, the slow axis image spot size at the fiber input for the beams near the center is smaller than that for beams near the edge of the beam stack. The corresponding beams are also shaped in the fast axis, but in the opposite direction as for slow axis. For example, beams near the center of the vertical stack are shaped to have smaller fast axis NA than beams near the edge. Similarly, the fast axis image spot size at the fiber input for the beams near the center is larger than those near the edge. The beam shaping in both axes are selected so that the spot of each beam fills up the fiber core equivalently or approximately equivalently, even though the aspect ratios between the fast and slow axis image spot sizes are different between beams. In some examples, the beam shaping can reduce an ensemble fast axis NA. In some examples, the beam examples can allow stacking additional diode laser emitters per polarization within the same fast axis NA.

Figure 2A:
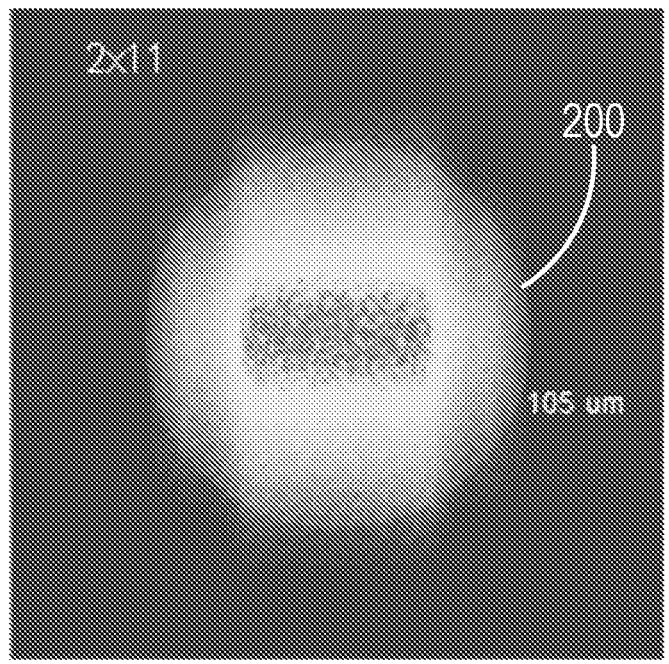
FIG. 2A is a modeled spot image at an input of a 105 μm fiber and 0.15 NA according to examples of the disclosed technology.
Figure 2B:
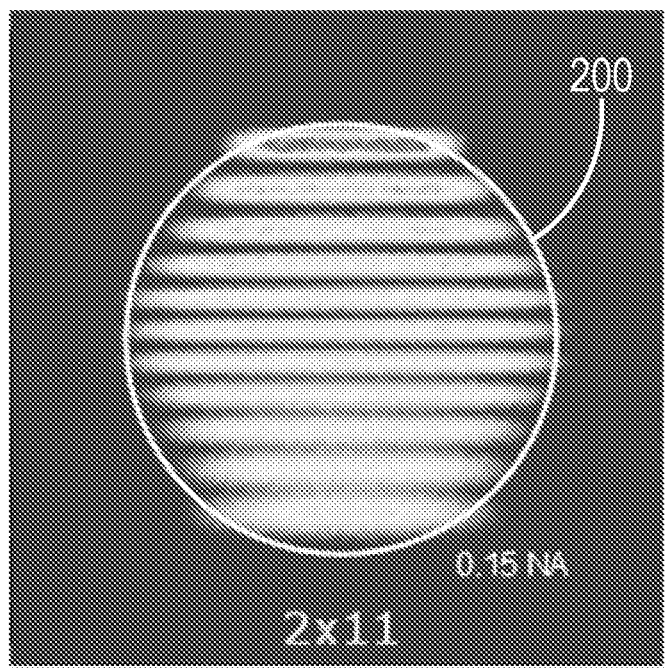
FIG. 2B is a modeled NA excitation at the input of the 105 μm fiber and 0.15 NA shown in FIG. 2A.

FIGS. 2A-2B plot the modeled spot and NA excitation at the input of a 105 μm fiber and 0.15 NA, according to some brightness enhancing examples herein that use beam shaping. As a way of contrasting, the same diodes as used in the package shown in FIGS. 1A and 1B are used in FIGS.

2A-2B. However, beams from a total of eleven emitters per polarization can be coupled in an input face 200 of an optical fiber, with the same fiber coupling efficiency and NA excitation (>97% fiber coupling efficiency and >99% power enclosure within 0.15 NA). The fiber coupled power and brightness of the package is 22% higher than that shown in FIGS. 1A-1B due to the two additional coupled diode beams per polarization. As shown in FIGS. 2A-2B, the physical spot and NA of the beam stack is effectively circularized to an extent, better filling up the circular space of the fiber in both physical and NA space.

Figure 3:
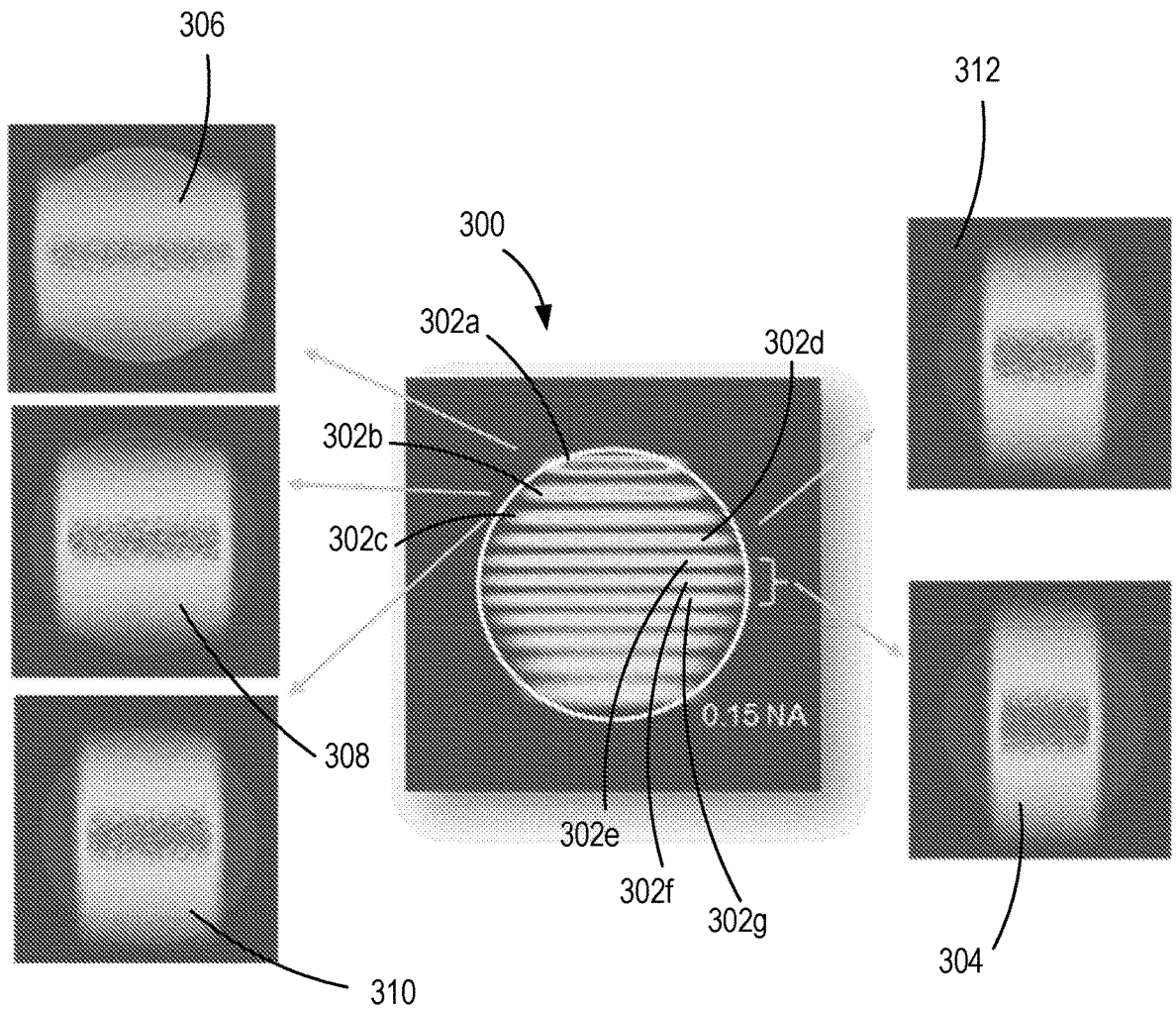
FIG. 3 are the modeled images at the input of a 105 μm fiber and 0.15 NA for the different beams in the vertical beam stack shown in FIGS. 2A-2B.

FIG. 3 illustrates the different beams in a vertical beam stack 300 being shaped differently, according to a representative beam shaping example. For the three beams 302e, 302f, 302g near the center of the beam stack, the image spot 304 is elongated in the fast axis and compressed in the slow axis. This corresponds to an increased NA in the slow axis but a reduced NA in the fast axis for the beams 302e-302g. For the beam 302a near the edge of the beam stack 300, the image spot 306 is elongated in the slow axis and compressed in the fast axis, resulting in an increased NA in the fast axis and reduced NA in the slow axis. Image space images 308, 310, 312 for the beams 302b, 302c, 302d between the center beams 302e-302g and the edge beam 302 show a gradual change in aspect ratio according to beam position. By using beam shaping optics, such as according to examples herein, the circular space, both physical and NA, of the fiber can be more completely filled, to allow additional beams/diodes coupled into the same fiber per polarization. While eleven beams are shown in FIG. 3, it will be appreciated that any number of beams and emitters may be used that may be coupled into an optical fiber, and any desired beam multiplexing scheme may be optionally used.

Various configurations of beam shaping optics can be used alone or combined with each other to circularize an ensemble image space and NA space of a collection of laser diode beams emitted from respective laser diodes. For example, one or more of the beam specific variables (with superscript i) in Eq. (1), (2), (3) and (4) above can be varied for shaping the image spot size and NA of individual beams in the vertical beam stack, to reduce the ensemble fast axis NA in Eq. (3).

In some examples, various FAC lens can be used with different corresponding focal lengths, $f_{FAC}^i$, and various SAC lens can be used with different corresponding focal lengths, $f_{SAC}^i$, for different beams. In some of such examples, various stair heights, $d_{stair}^i$, can be selected to match the FAC lens focal length (e.g., a smaller stair height can be selected to match a longer focal length FAC lens, and vice versa), while maintaining the other variables, such as), $B_{FA}^i$, $B_{SA}^i$ $M_{FAT}^i$ and $M_{SAT}^i$ constant among different beams. For example, the FAC (SAC) focal lengths for the beams near the center of the vertical beam stack can be shorter (longer) than those for the beams near the edge of the stack. According to Eq. (1), (2) and (4), this leads to a larger (smaller) image spot size, $D_{FA}^i$ ($D_{SA}^i$) in the fast (slow) axis for the center beams than the edge beams, and larger slow-axis NA, $NA_{SA}^i$ for the center beams. The stair height for each beam can be matched to the FAC lens focal length, leading to a smaller ensemble fast axis NA, $NA_{FA}^i$, according to Eq. (3). In further examples, a fast axis telescope beam compressor can be used to vary a relative beam spacing in the fast axis.

Figure 4A:
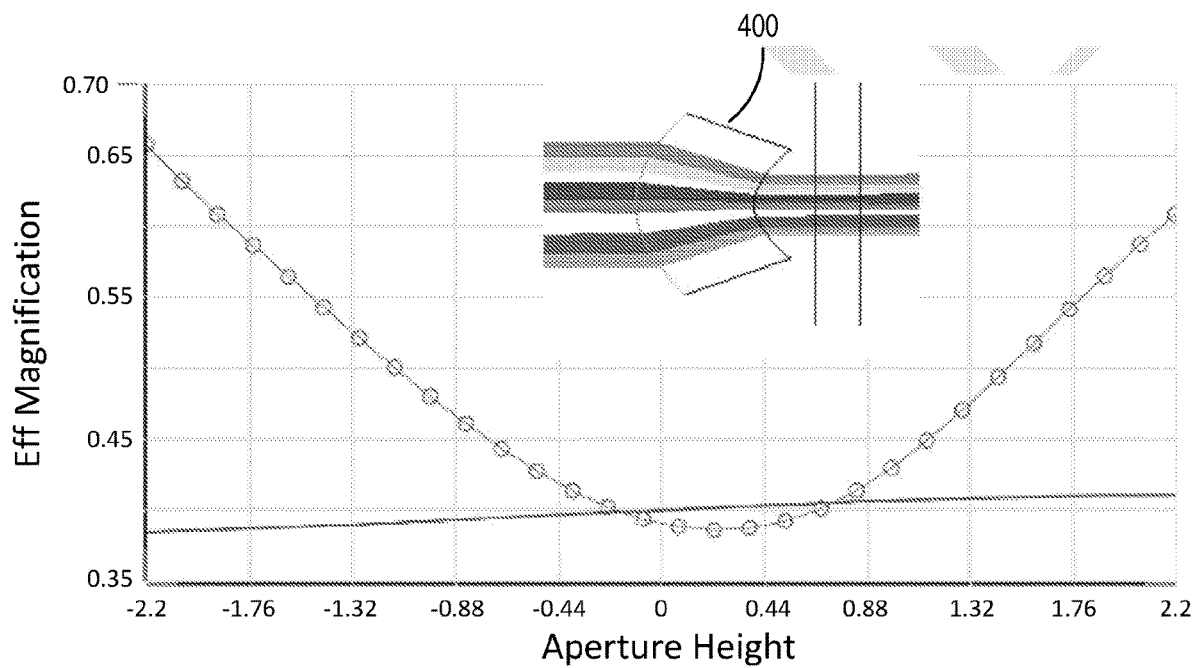
FIG. 4A is a plot of the effective magnification of a variable fast axis telescope (VFAT) providing variable magnification of a collimated beam depending on the transverse position of the beam. A non-variable FAT as used in laser diode packages is also plotted for comparison.
Figure 6:
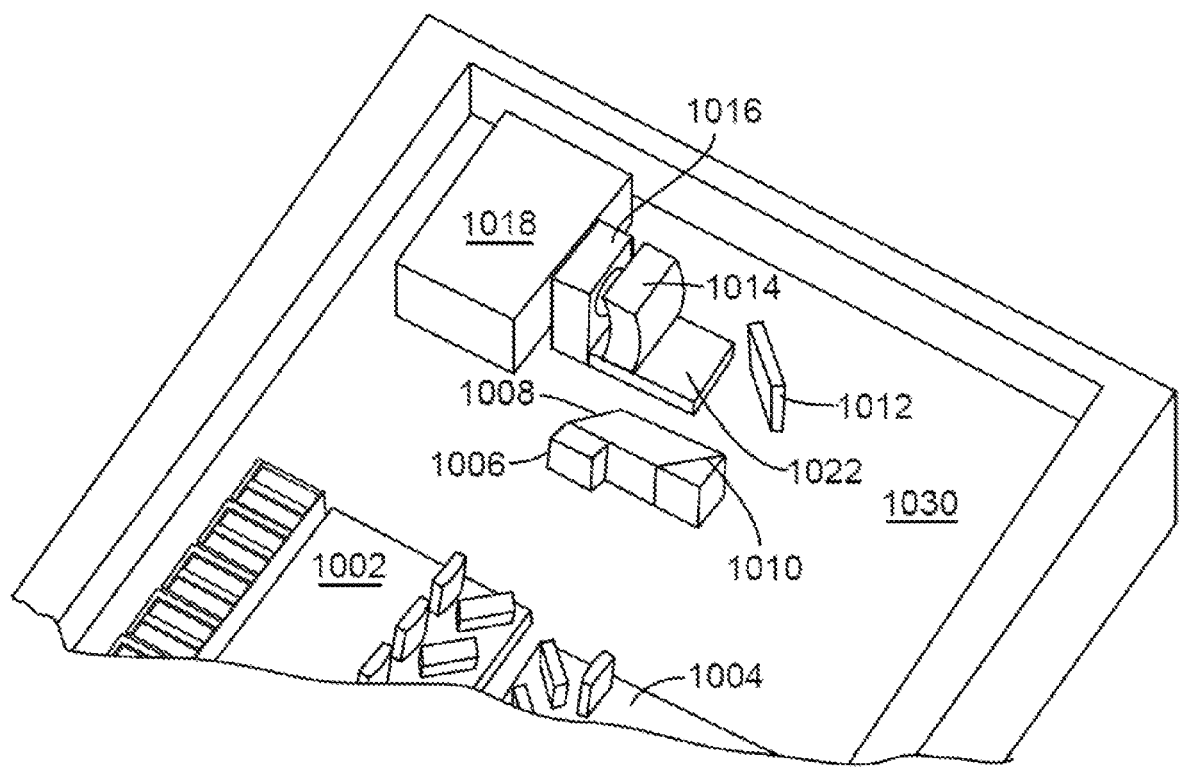
FIG. 6 is a perspective cutaway view of an example laser diode package.

In further examples, a variable magnification fast axis telescope (VFAT) can be used to produce a variable magnification and relative fast axis beam spacing $M_{FAT}^i$, while allowing the convenient option in many examples of maintaining other variables constant or even among different beams (such as FAC lens focal lengths, stair heights, and SAT magnification $M_{SAT}^i$). Examples of suitable VFATs are disclosed in the related provisional application 62/886,912 and hereinbelow. VFATs can be 1-piece optics, such as the VFAT example 400 shown in FIG. 4A, or multiple lenses or lens elements. VFAT examples can be configured to provide variable magnification of a collimated beam depending on a transverse position of the beam relative to an optical axis of the VFAT. In specific examples, VFATs produce a lower magnification to the beams incident near the center of the beam stack, so as to produce a larger fast axis image spot size, $D_{FA}^i$ for the center beams than the edge beams. FIG. 4A also shows the magnification of a FAT without a variable magnification, which has effectively an approximately constant magnification across the transverse direction of the optical axis. FIG. 6 shows an example laser diode package (with a lid removed) that combines beams of two different laser diode sub-assemblies 1002, 1004 using a polarization multiplexer assembly including a half-wave plate 1006, prism surface 1008, and polarizing beam splitter 1010. In examples herein, a fast axis telescope 1014 can be configured as a VFAT. The variably magnified beams are then focused with focusing optic 1016 to a coupling plane of an optical fiber. It will be appreciated that the emitter and beam combining arrangement disclosed in FIG. 6 is only an illustrative example, not being exhaustive or limiting, and that numerous other laser diode package configurations may be used.

Figure 4B:
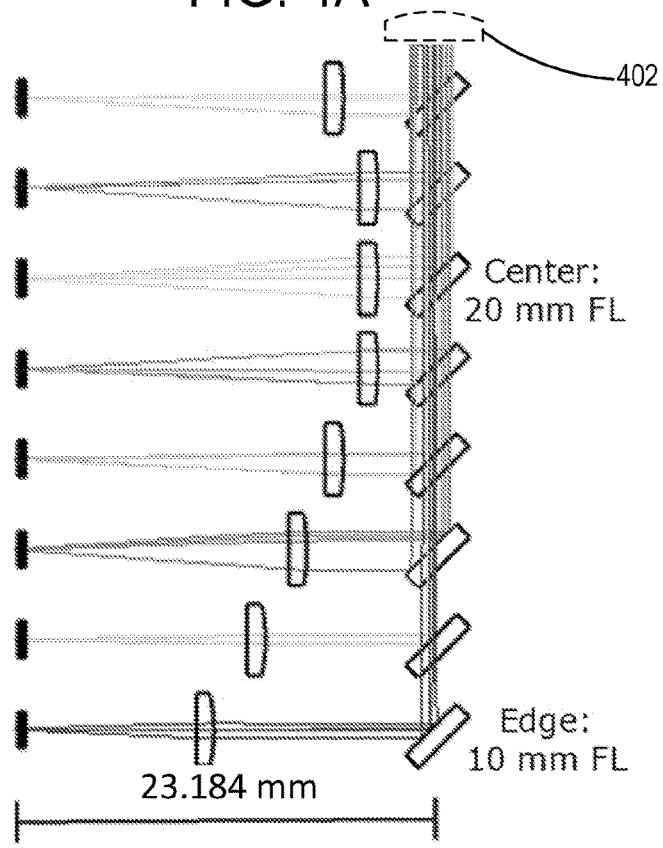
FIG. 4B is plan view schematic showing an example where specific SAC lenses are used per beam with various focal lengths to achieve the results of the specific design modeled in FIGS. 2A and 2B.

In some VFAT examples, various SAC lenses can be used with different corresponding SAC lens focal lengths, $F_{SAC}^i$, for Different Beams. An Example with Specific SAC Lenses with various focal lengths can be seen in FIG. 4B. In the specific example, the focal lengths for the different SACs vary from 20 mm for the center beam to 10 mm for the edge beam though it will be appreciated that various values may be used depending on the package, diode, and other optical characteristics. Turning mirrors are used to direct the beams into a vertical stack. With the variable focal lengths for the SACs, a smaller slow axis image spot size, $D_{SA}^i$, is obtained at the fiber for the center beams than the edge beams, and larger slow-axis NA, $NA_{SA}^i$ is obtained for the center beams. According to Eq. (3), the arrangement of variable magnification $M_{FAT}^i$ leads to a reduced ensemble fast axis NA without the need to change the stair heights.

In further VFAT examples, various slow axis diode beam sizes (near fields), $B_{SA}^i$, can be provided for different beams in the vertical beam stack, while in some examples maintaining the other variables among different beams constant in Eq. (1) to (4). For example, the slow axis beam size variation can be achieved on chip in the diode laser single emitters with different waveguide characteristics such as waveguide dimension, such as using flared laser oscillator waveguides (FLOW) with various near fields, other than obtained optically. Specifically, a smaller slow axis beam size for diodes near the center of the beam stack can allow for a smaller slow axis image spot size, $D_{SA}^i$. Assuming a fixed BPP for each diode laser single emitter, slow axis full width divergence angle, $\varphi_{SA}^i$, is inversely proportional to the slow axis beam size, resulting in a larger slow axis NA, $NA_{SA}^i$, according to Eq. (4). Again, the VFAT allows a larger fast axis image spot size, $D_{FA}^i$ for the center beams than the edge beams. According to Eq. (3), such arrangement of variable magnification $M_{FAT}^i$, can lead to a reduced ensemble fast axis NA at a coupling plane without the need to change the stair heights.

Figure 5:
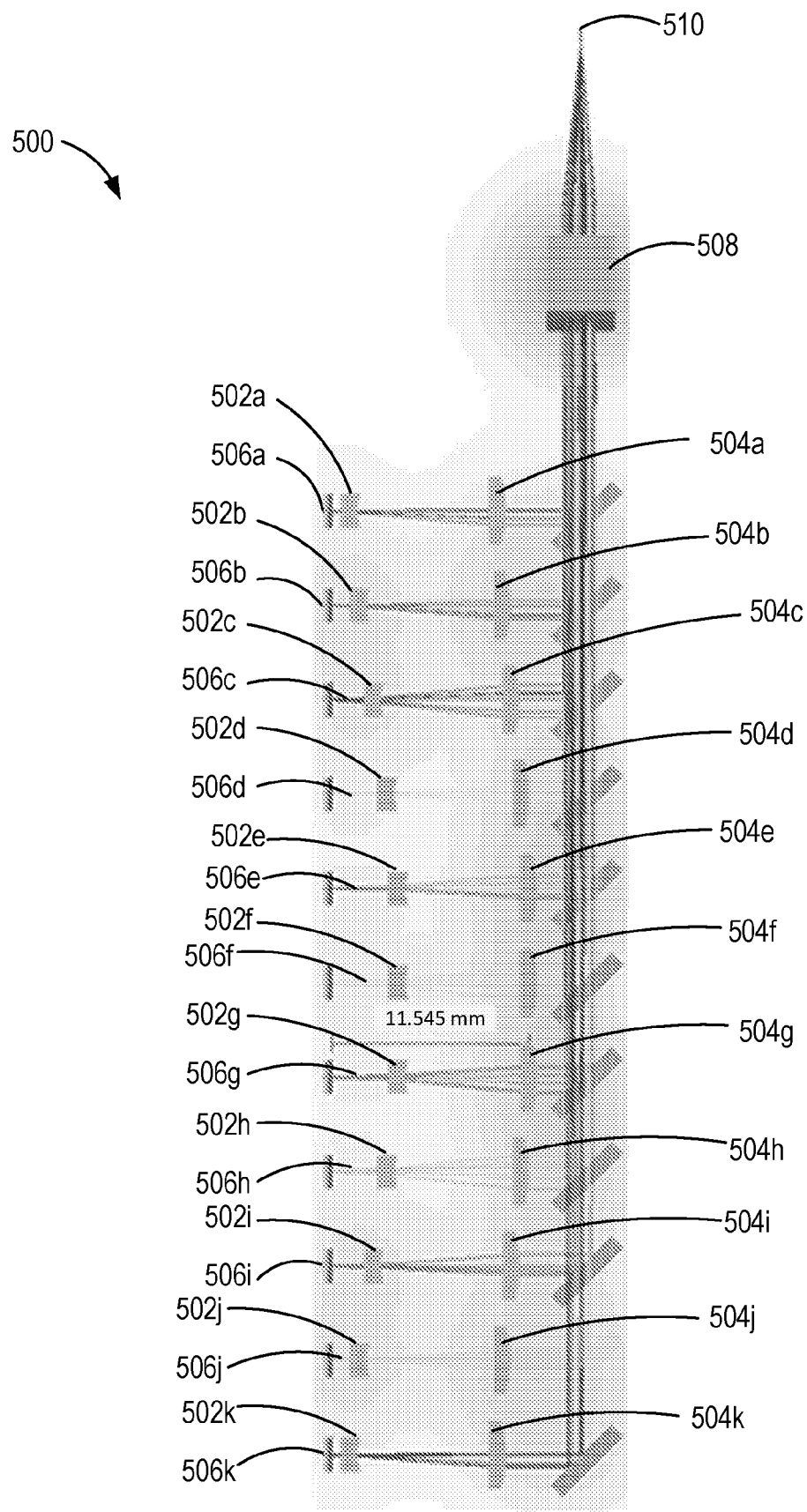
FIG. 5 is a plan view schematic of an beam shaping arrangement for a laser diode package where beams are emitted from successive heights, collimated with SAC pairs, and turned to form a beam stack. Two SAC lenses per beam are used to achieve various slow axis focal lengths for the specific design modeled in FIGS. 2A and 2B.

In additional examples, a VFAT can be used to provide variable fast axis magnification and beam displacement, and two-lens SAC pairs can be used for each beam. In some SAC pair examples, such as the beam shaping optics arrangement 500 shown in FIG. 5, two SAC lenses 502a-502k, 504a-504k per beam 506a-506k of the same focal lengths are used, with various slow axis focal lengths achieved through varying the separation between the two lenses and displacement of the two lenses from the diodes emitting the beams. That is, each of the plano-concave first SAC elements 502a-502k can have a common focal length, and each of the plano-convex second SAC elements 504a-504k can have a common focal length. A VFAT and focusing optics 508 can then receive the beams and form a circularized beam ensemble at a coupling or focusing plane 510, which can correspond to a an optical fiber input face, a relay system, etc. In additional SAC pair examples, such as that shown in FIG. 4B, a first SAC lens for each diode of one half of a stack has a different focal length, and a common second SAC lens, such as the dashed lens element 402 in FIG. 4B, can be placed in the afocal plane to provide optical power on all beams in the beam stack. The beams after the first SAC lenses (which can be plano-convex, plano-concave, etc.) are not slow-axis collimated, but become collimated in the slow axis after the second common SAC lens. This allows working distances of the first SAC lenses that are different from ones shown on the right of FIG. 4B, and can allow a shorter spacing for a smaller laser diode package form factor or volume.

In further examples, a variable magnification fast axis telescope (VFAT) $M_{FAT}^i$ can be used along with a variable magnification slow axis telescope (VSAT) $M_{SAT}^i$ while maintaining the other variables, such as $B_{FA}^i$, $B_{SA}^i$ $f_{FAC}^i$, $f_{SAC}^i$ and $d_{stair}^i$ constant among different beams. Variation of the VFAT and VSAT is along the transverse direction, such that different magnification for different beams in the vertical stack are provided for both the slow axes and fast axes. Examples can include arrangements with separate telescopes, such as one VFAT and one VSAT, but could also be one telescope that implements the variable magnification for both axes.

In general, examples herein can more efficiently fill a circular space of a coupling plane, such as a fiber, both physical and NA, through beam shaping of the diode laser beams, so as to allow more single emitters to generate beams for coupling into the same fiber, so that brightness improvement is achieved. While example brightness improvements of 22% are shown, higher improvements can be achieved as well, including as high as 57% power and brightness improvement in some examples where all the "dead space" in the physical and NA space due to mismatch between a circular space of the fiber and rectangular beam shape becomes filled, where 57% is the additional area in a circle over a rectangle having the same length of diameter and diagonal, respectively.

VFAT Examples

As discussed above, laser diode packages typically couple laser diode beams emitted from rectangular diode facets into a circular fibers. This leads to unused spatial and angular laser properties associated with laser diode ensembles optically and physically arranged for fiber coupling at ensemble coupling planes (such as fiber input faces). There is a significant problem associated with the laser diodes' rectangular high aspect ratio in both physical and angular space and the mismatch with the circular space of the fiber. The circular spaces of the fiber can be more completely filled by varying laser diode chip geometries or varying FAC lenses for different laser diodes but such approaches are not typically cost effective.

By using one or more variable afocal telescope examples described herein, channel specific optics or layouts can be reduced or avoided, by providing variable magnification of a collimated beam. When applied to a laser diode package to angularly and spatially circularize its aggregate beam, individual diode channels can receive specific different magnifications based on, for example, their particular NA space juxtaposition or arrangement. This varying magnification varies their vertical physical dimension at focus, which can allow a net higher compression of the aggregate beam space so that, for example, additional laser channels can be added within the same NA of the fiber input.

Monolithic telescope optics typically provide a single-magnification ratio associated with surfaces of differing but constant curvatures. Alternatively, the surfaces are made aspheric to reduce spherical aberration across its clear aperture. In some examples herein, a variable magnification can be provided with a variable afocal telescope, allowing an increase of output brilliance (i.e., radiance) by up to 22% in various laser diode packages examples. For example, a fiber-coupled laser diode package that uses eighteen single-emitter laser diodes to generate beams and optics to couple the beams into a 0.15 NA 105 μm output fiber can instead use twenty-two single-emitter laser diodes of the same type to generate beams and use optics (including the variable afocal telescope) to couple the beams into the same 0.15 NA 105 μm output fiber.

Figure 7:
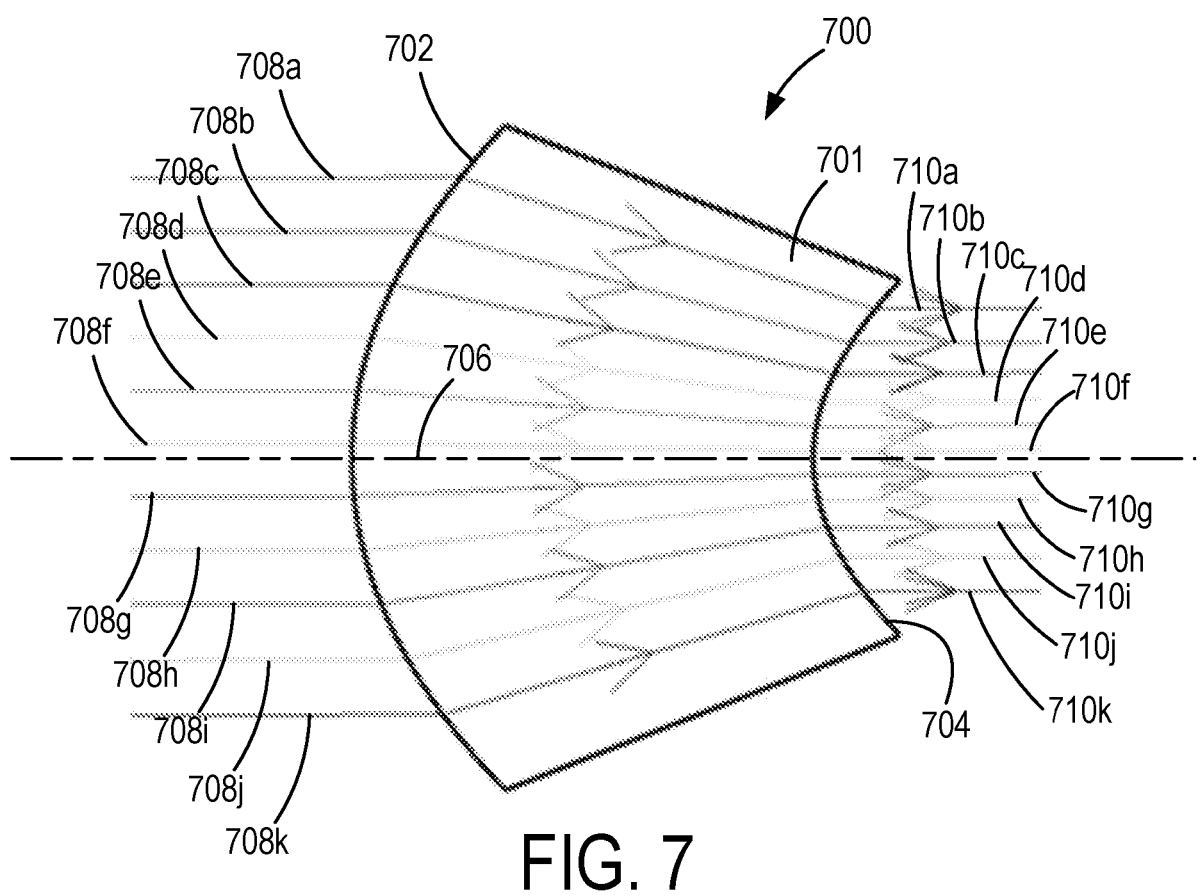
FIG. 7 shows a side view schematic of an example VFAT similar to the VFAT shown in FIG. 4A.

FIG. 7 shows a physical form factor and surface shape for an example afocal telescope 700. The afocal telescope 700 includes a transmissive optical substrate 701 having a first surface 702 that is convex and a second surface 704 that is concave, each having respective curvatures defined thereon. The transmissive optical substrate 701 can be made of different materials, or have portions with different materials, including glasses, plastics, fused silica, transparent crystalline or non-crystalline materials. The curvatures for the first and second surfaces 702, 704 can be symmetric across an optical axis 706 of the afocal telescope 700 in the plane of FIG. 7. In representative examples, the afocal telescope 700 is a unitary cylindrical meniscus lens, with the cylindricity associated with a lack of a rotational symmetry about the optical axis 706 (such as with a spherical lens) rather than constant curvatures of cylinders. In additional examples, separate lens elements spaced apart from each other can be used to form a non-unitary lens or separate lens elements can be joined together to form a unitary lens having a plurality of elements. One or both of the first and second surfaces 702, 704 can have a hyperbolic shape. As shown, the first surface 702 has a parabolic shape and the second surface 704 has a hyperbolic shape. The shapes can define higher curvature pairs (magnification) near the center (e.g., closer to the optical axis 706) and more gradual curvatures near the edges of aperture of the afocal telescope 700. In further examples, afocal telescopes can be configured to provide variable slow axis magnifications or can have complex shapes configured to provide both variable fast and slow axis magnifications.

FIG. 7 also shows a plurality of input beam axes 708a-708k that are parallel to each other and parallel to the optical axis 706. Each of the input beam axes 708a-708k can be associated with a laser diode beam that is collimated in both a fast axis dimension and a slow axis dimension. With the adjacent arranged parallel input beam axes 708a-708k, the afocal telescope 700 is configured as a fast axis telescope such that a common fast axis of the laser diode beams generally extends perpendicular to the optical axis 706 in the plane of FIG. 7 (e.g., up and down). Following the ray trace, the laser diode beams propagate through the substrate 701 and become compressed to propagate along output beam axes 710a-710k, with the distance between the two outer output beam axes 710a, 710k being shorter than the distance between the two outer input beam axes 708a, 708k.

As shown, the input beam axes 708-708k have displacements from each other forming an even spacing. In representative examples, based on the selected curvatures of the first and second surfaces 702, 704, the compressed output beam axes 710a-710k are not evenly spaced. Instead, as the displacement distance from the optical axis 706 increases, adjacent output beam axes are increasingly displaced from each other, so that displacement between output beam axes 710e, 710f is smaller than the displacement between output beam axes 710d, 710e, which is smaller than the displacement between output beam axes 710c, 710d, which is smaller than the displacement between output beam axes 710b, 710c, which is smaller than the displacement between output beam axes 710a, 710b, etc. Thus, a linear input spacing can produce a variable output spacing, such that a linearly increasing (e.g., an even spacing) input beam displacement from the optical axis 706 produces a nonlinear increase in output beam displacement. Based on the curvature symmetries across the optical axis 706, a similar effect is achieved below the optical axis 706 in FIG. 7, so that displacement between output beam axes 710g, 710h is smaller than the displacement between output beam axes 710h, 710i, which is smaller than the displacement between output beam axes 710i, 710j, which is smaller than the displacement between output beam axes 710j, 710k, etc.

In representative examples, for laser diode beams propagating along the input beam axes 708a-708k with a common cross-sectional shape (e.g., each having identical area and aspect ratio), the afocal telescope 700 introduces a variable magnification for the laser diode beams propagating along the output beam axes 710a-710k that is dependent on the displacement distance of the respective input beam axes 708a-708k from the optical axis 706. For example, with reference to FIG. 4A, the variable magnification can be produced as shown and discussed previously, such that for an increasing distance from the optical axis 706, a magnification increases for a transmitted laser diode beam. For comparison, the magnification line showing the approximately flat magnification of an afocal telescope does not provide a variable magnification. Thus, the laser diode beams propagating along input beam axes 708a, 708k are compressed in the fast axis direction by a smaller amount than the laser diode beams propagating along input beam axes 708f, 708g. The reduced compression for laser diode beams propagating along input beam axes 708a, 708k produces a smaller spot size in physical space in the fast axis direction at a subsequent coupling plane (such as an optical fiber) after propagation through an objective lens. In contrast, the increased compression for laser diode beams propagating along input beam axes 708f, 708g produces a larger spot size in physical space in the fast axis direction at the subsequent coupling plane after propagation through the objective lens. By selecting slow axis magnification separately, the laser diode beams propagating along input beam axes 708f, 708g can have the larger fast axis image dimension at the coupling plane and a smaller slow axis image dimension at the coupling plane, and the laser diode beams propagating along input beam axes 708a, 708k can have the smaller fast axis image dimension at the coupling plane and a larger slow axis image dimension at the coupling plane. A resulting ensemble or aggregate beam image in physical space is shown in FIG. 2A. The different aspect ratios for the different laser diode beams are imaged on the fiber to produce a circularized ensemble image in physical space. As discussed hereinabove, FIG. 1A shows an example of an ensemble beam image in which beams do not propagate through an afocal telescope providing variable magnification, resulting in a square shaped image as each beam images a common overlapping area. By introducing the variable spacing and variable magnification among the output beam axes 710a-710k with the afocal telescope 700, additional laser diode beams can be focused at the coupling plane, increasing coupled brightness.

Figures 8A, 8B:
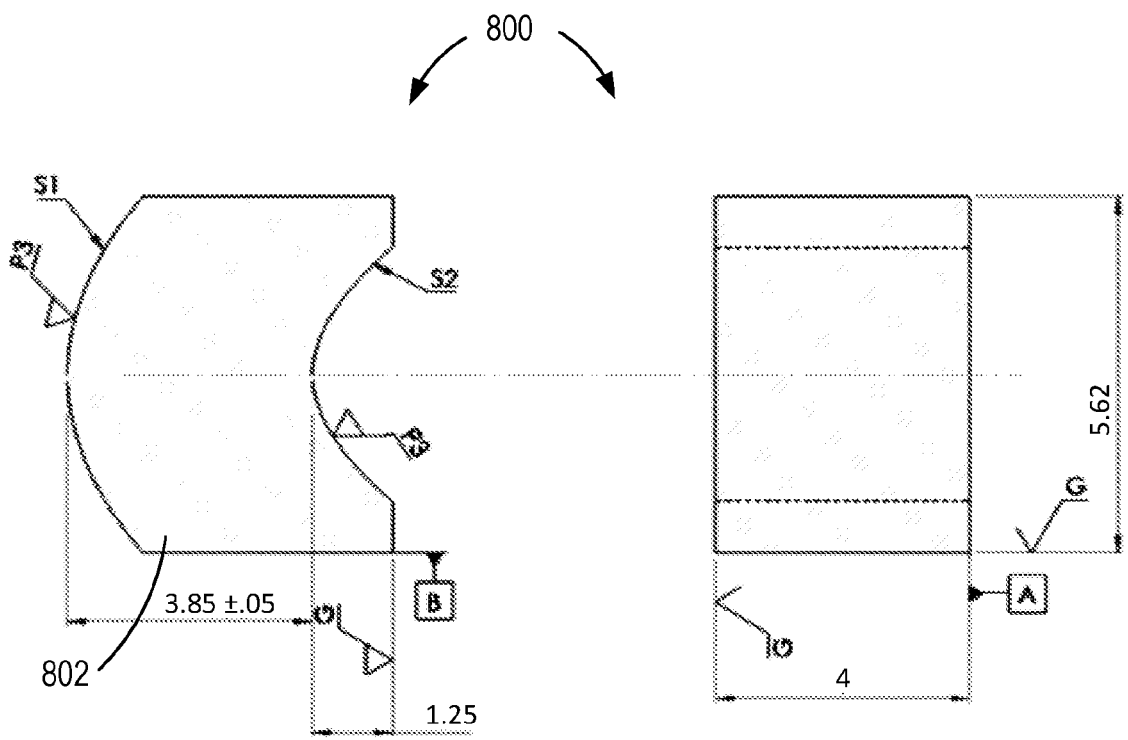
FIG. 8A are side and end views of an example VFAT.
FIG. 8B is a SAG equation and associated coefficients for the example fast axis telescope in FIG. 8A.

FIG. 8A shows another example of an afocal telescope 800 configured to provide variable magnification, with FIG. 8B including the sag equation and suitable coefficients for surfaces S1, S2. The coefficients generally define the surface S1 as a parabolic or elliptical with k being close to −1, and the surface S2 as a hyperboloid with k<−1. As shown, the afocal telescope 800 includes a flat reference surface 802, which can be used to register the afocal telescope 800 to a base of a laser diode package housing so as to improve alignability with a plurality of laser diode beams directed through an interior of the laser diode package.

General Considerations

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the implementation and are readily discernible by one of ordinary skill in the art.

In some examples, values, procedures, or apparatus' are referred to as "lowest", "best", "minimum," or the like. It will be appreciated that such descriptions are intended to indicate that a selection among many used functional alternatives can be made, and such selections need not be better, smaller, or otherwise preferable to other selections. Examples are described with reference to directions indicated as "above," "below," "upper," "lower," and the like. These terms are used for convenient description, but do not imply any particular spatial orientation.

Theories of operation, scientific principles, or other theoretical descriptions presented herein in reference to the apparatus or methods of this disclosure have been provided for the purposes of better understanding and are not intended to be limiting in scope. The apparatus and methods in the appended claims are not limited to those apparatus and methods which function in the manner described by such theories of operation.

In view of the many possible embodiments to which the principles of the disclosed technology may be applied, it should be recognized that the illustrated embodiments are only representative examples and should not be taken as limiting the scope of the disclosure. Alternatives specifically addressed in these sections are merely exemplary and do not constitute all possible alternatives to the embodiments described herein. For instance, various components of systems described herein may be combined in function and use. We therefore claim all that comes within the scope of the appended claims.

We claim:

1. An apparatus, comprising:
   a plurality of laser diodes configured to emit respective laser diode beams having perpendicular fast and slow beam divergence axes mutually perpendicular to respective beam axes; and
   beam shaping optics configured to receive the laser diode beams and to circularize an ensemble image space and NA space of the laser diode beams at an ensemble coupling plane,
   wherein the beam shaping optics are configured to receive the laser diode beams with the beam axes parallel to each other and stacked as a vertical stack,
   wherein the laser diode beams near a center of the vertical stack have a larger slow axis NA than the laser diode beams near an edge of the vertical stack, and
   wherein the laser diode beams near the center of the vertical stack have a smaller fast axis NA than the laser diode beams near the edge of the vertical stack.

2. The apparatus of claim 1, wherein the beam shaping optics comprise:
   a plurality of fast axis collimators with different focal lengths configured to produce different corresponding fast axis magnifications for the respectively received beams; and
   a plurality of slow axis collimators with different focal lengths configured to produce different corresponding slow axis magnifications for the respectively received beams.

3. The apparatus of claim 2, wherein the laser diodes are arranged on stairs of a base such that the fast beam divergence axes are parallel to and spaced apart from each other and such that the beam axes are nonlinearly spaced apart from each other along the direction of the parallel fast beam divergence axes.

4. The apparatus of claim 2, wherein the beam shaping optics further comprise a fast axis beam compressor configured to receive the laser diode beams having the respective magnifications as collimated beams and to produce an afocal nonlinear beam displacement along a fast axis direction.

5. The apparatus of claim 1, wherein the beam shaping optics comprise:
   an afocal fast axis telescope configured to receive the laser diode beams as fast-axis and slow-axis collimated beams with the beam axes parallel to each other and stacked along a common fast axis to define a plurality of initial beam displacements relative to an optical axis of the afocal fast axis telescope, and to compress the laser diode beams along the common fast axis such that, for a linear increase in input beam displacement from the optical axis, the afocal fast axis telescope produces an increasing fast-axis compressed beam magnification and a nonlinear increase in a compressed beam displacement from the optical axis.

6. The apparatus of claim 5, wherein the beam shaping optics further comprise a plurality of slow axis collimators with different focal lengths configured to produce different corresponding slow axis magnifications for the respective laser diode beams.

7. The apparatus of claim 5, wherein the plurality of laser diodes includes waveguide dimensions that are different for different ones of the laser diodes to define different respective divergences along the slow axis beam divergence axes.

8. The apparatus of claim 5, wherein the afocal telescope includes first and second surfaces having respective curvatures that circularize the ensemble image space and NA space of the laser diode beams at the ensemble coupling plane by elongating images at the ensemble coupling plane along the common fast axis for laser diode beams having smaller input beam displacements relative to the optical axis and shortening images at the ensemble coupling plane along the common fast axis for laser diode beams having larger input beam displacements relative to the optical axis.

9. The apparatus of claim 1, wherein the beam shaping optics comprise:
   a plurality of slow axis collimator pairs comprising first and second slow axis collimators, each slow axis collimator pair configured to receive one of the laser diode beams and to produce a slow axis collimated beam after the second slow axis collimator;
   wherein the first slow axis collimators have a common focal length and the second slow axis collimators have a common focal length;
   wherein for each slow axis collimator pair, a distance between first and second slow axis collimators of the pair and a distance between a diode facet and the first slow axis collimator are arranged to produce a different slow axis image magnification for different respective laser diode beams.

10. The apparatus of claim 9, wherein the laser diodes are arranged on stairs of a base such that the fast beam divergence axes are parallel to and spaced apart from each other and such that the beam axes are nonlinearly spaced apart from each other along the direction of the parallel fast beam divergence axes.

11. The apparatus of claim 9, wherein the beam shaping optics comprise:
   an afocal fast axis telescope configured to receive the laser diode beams as fast-axis and slow-axis collimated beams with the beam axes parallel to each other and stacked along a common fast axis to define a plurality of initial beam displacements relative to an optical axis of the afocal fast axis telescope, and to compress the laser diode beams along the common fast axis such that, for a linear increase in input beam displacement from the optical axis, the afocal fast axis telescope produces an increasing fast-axis compressed beam magnification and a nonlinear increase in a compressed beam displacement from the optical axis.

12. The apparatus of claim 1, wherein the beam shaping optics comprise:
   a plurality of first slow axis collimators configured to receive respective laser diode beams, wherein the first slow axis collimators have different focal lengths;
   a common second slow axis collimator configured to receive the laser diode beams and to produce respective slow axis collimated beams after the second slow axis collimator;
   wherein distances between first slow axis collimators and the second slow axis collimator and a distance between diode facets and the first slow axis collimators are arranged to produce a different slow axis image magnification for different respective laser diode beams.

13. The apparatus of claim 12, wherein the laser diodes are arranged on stairs of a base such that the fast beam divergence axes are parallel to and spaced apart from each other and such that the beam axes are nonlinearly spaced apart from each other along the direction of the parallel fast beam divergence axes.

14. The apparatus of claim 12, wherein the beam shaping optics comprise:
   an afocal fast axis telescope configured to receive the laser diode beams as fast-axis and slow-axis collimated beams with the beam axes parallel to each other and stacked along a common fast axis to define a plurality of initial beam displacements relative to an optical axis of the afocal fast axis telescope, and to compress the laser diode beams along the common fast axis such that, for a linear increase in input beam displacement from the optical axis, the afocal fast axis telescope produces an increasing fast-axis compressed beam magnification and a nonlinear increase in a compressed beam displacement from the optical axis.

15. The apparatus of claim 1, wherein the beam shaping optics comprise:
   an afocal fast axis telescope configured to receive the laser diode beams with the beam axes parallel to each other and stacked along a common fast axis, and configured to compress the beams along the common fast axis such that, for a linear increase in parallel input beam displacement from an optical axis of the afocal fast axis telescope along the common fast axis, the afocal fast axis telescope produces a decreasing fast-axis image magnification and a nonlinear increase in a transmitted parallel beam displacement along the common fast axis; and
   an afocal slow axis telescope configured to receive the laser diode beams with the beam axes parallel to each other and stacked along the common fast axis, and configured to produce an increase in slow-axis image magnification for an increase in parallel input beam displacement from an optical axis of the afocal slow axis telescope along the common fast axis.

16. The apparatus of claim 15, wherein the afocal fast axis telescope and the afocal slow axis telescope form a combined afocal telescope having at least one curved surface rotationally symmetric about a common optical axis.

17. A method, comprising:
   arranging a plurality of laser diodes in a laser diode package, wherein the laser diodes are configured to emit respective laser diode beams having perpendicular fast and slow beam divergence axes mutually perpendicular to respective beam axes; and
   arranging beam shaping optics in the laser diode package, wherein the beam shaping optics are configured to receive the laser diode beams and to circularize an ensemble image space and NA space of the laser diode beams at an ensemble coupling plane,
   wherein the beam shaping optics are configured to receive the laser diode beams with the beam axes parallel to each other and stacked as a vertical stack,
   wherein the laser diode beams near a center of the vertical stack have a larger slow axis NA than the laser diode beams near an edge of the vertical stack, and
   wherein the laser diode beams near the center of the vertical stack have a smaller fast axis NA than the laser diode beams near the edge of the vertical stack.

18. The method of claim 17, wherein the arranged beam shaping optics comprise:
   an afocal fast axis telescope configured to receive the laser diode beams as fast-axis and slow-axis collimated beams with the beam axes parallel to each other and stacked along a common fast axis to define a plurality of initial beam displacements relative to an optical axis of the afocal fast axis telescope, and to compress the laser diode beams along the common fast axis such that, for a linear increase in input beam displacement from the optical axis, the afocal fast axis telescope produces an increasing fast-axis compressed beam magnification and a nonlinear increase in a compressed beam displacement from the optical axis.

19. A method, comprising:
   emitting a plurality of laser diode beams from respective laser diodes, wherein the laser diode beams have perpendicular fast and slow beam divergence axes mutually perpendicular to respective beam axes; and
   circularizing an ensemble image space and NA space of the laser diode beams at an ensemble coupling plane with beam shaping optics configured to receive the laser diode beams,
   wherein the beam shaping optics are configured to receive the laser diode beams with the beam axes parallel to each other and stacked as a vertical stack,
   wherein the laser diode beams near a center of the vertical stack have a larger slow axis NA than the laser diode beams near an edge of the vertical stack, and
   wherein the laser diode beams near the center of the vertical stack have a smaller fast axis NA than the laser diode beams near the edge of the vertical stack.

20. The method of claim 19, wherein the beam shaping optics comprise:
   an afocal fast axis telescope configured to receive the laser diode beams as fast-axis and slow-axis collimated beams with the beam axes parallel to each other and stacked along a common fast axis to define a plurality of initial beam displacements relative to an optical axis of the afocal fast axis telescope, and to compress the laser diode beams along the common fast axis such that, for a linear increase in input beam displacement from the optical axis, the afocal fast axis telescope produces an increasing fast-axis compressed beam magnification and a nonlinear increase in a compressed beam displacement from the optical axis.

* * * * *